United States Patent
Tepman et al.

(10) Patent No.: US 6,430,468 B1
(45) Date of Patent: Aug. 6, 2002

(54) METHOD AND APPARATUS FOR ACCURATE PLACEMENT OF SEMICONDUCTOR WAFERS ONTO RESPECTIVE PLATFORMS WITHIN A SINGLE REACTION CHAMBER

(75) Inventors: Avi Tepman, Cupertino; Lawrence Chung-Lai Lei, Milpitas, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 44 days.

(21) Appl. No.: 09/716,039

(22) Filed: Nov. 17, 2000

(51) Int. Cl.$^7$ .................................................. G06F 7/00
(52) U.S. Cl. ............. 700/218; 414/222.04; 414/226.01; 414/936; 438/680
(58) Field of Search .................................. 414/217, 936, 414/939, 941, 222.04, 222.06, 226.01; 700/213, 218, 258, 114; 438/680

(56) References Cited

U.S. PATENT DOCUMENTS

| | | | | |
|---|---|---|---|---|
| 4,819,167 A | * | 4/1989 | Cheng et al. | 364/167.01 |
| 5,855,681 A | * | 1/1999 | Maydan et al. | 118/719 |
| 6,071,055 A | * | 6/2000 | Tepman | 414/217 |
| 6,155,773 A | * | 12/2000 | Ebbing et al. | 414/744.5 |
| 6,315,512 B1 | * | 11/2001 | Tabrizi et al. | 414/217 |

* cited by examiner

Primary Examiner—Joseph E. Valenza
Assistant Examiner—Khoi H. Tran
(74) Attorney, Agent, or Firm—Ostroff & Associates

(57) ABSTRACT

Method and apparatus are provided for accurately placing first and second semiconductor wafers onto a first and a second platforms, respectively, in a single processing chamber despite changes in the exact positions of the platforms caused by variations in temperature within the chamber. A computer controls a mechanism having a pair of wafer-supporting blades to insert the wafers into the chamber. The computer determines from position sensors when the first wafer is centered over the first platform, then actuates lift pins associated with the first platform to lift the first wafer off of its respective blade. Then the computer in the same way in response to other position sensors moves the second wafer into alignment with the second platform, and raises by lift pins the second wafer off of its respective blade. Thereafter the computer removes the blades from the chamber, and lowers the wafers in precise positions onto their respective platforms.

10 Claims, 3 Drawing Sheets

METHOD AND APPARATUS FOR ACCURATE PLACEMENT OF SEMICONDUCTOR WAFERS ONTO RESPECTIVE PLATFORMS WITHIN A SINGLE REACTION CHAMBER

FIELD OF THE INVENTION

This invention relates to a method and apparatus for the accurate placement of semiconductor wafers onto respective platforms (or susceptors) within a single reaction chamber despite dimensional changes in the relative positions of the platforms due to thermal expansion or contraction of the chamber with changes in temperature.

BACKGROUND OF THE INVENTION

Present day semiconductors have much higher densities than semiconductor of only a few years ago. This has necessitated new or improved processes and production equipment. Today's semiconductor circuits have features such as vias with diameters that are a small fraction of a micron, for example, only about 0.13 micron, with depths of 4 to 5 times the diameter. Such small via diameters and large depth to diameter ratios make it difficult with previously used materials (e.g., aluminum or copper) to properly metalize the vias completely down to their lower ends. Accordingly, a chemical vapor metalizing process using a highly volatile precursor compound of tungsten such as tungsten hexaflouride ($WF_6$) is advantageously used to metalize the vias. In order to keep the tungsten being deposited on the exposed surface of the wafer from being deposited beyond and/or beneath the edge or rim of the wafer, inert gas, such as argon or argon mixed with helium, is flowed in an annular stream of the gas upward and over the rim. Flowing such a stream of inert gas, termed "edge-purging", reduces or eliminates tungsten deposition adjacent the edge of the wafer by diluting or physically excluding the $WF_6$ precursor gas. For edge-purging to be fully effective, however, each wafer should be accurately centered on its respective platform.

In order to increase manufacturing throughput for a given capital investment, two wafer platforms are mounted in a single processing chamber. However, the exact positions of the centers of the platforms can vary because of manufacturing tolerances or because of thermal expansion or contraction of the chamber caused in turn by changes of temperature within the chamber. Because such changes of temperature can easily be a hundred or more degrees Centigrade, dimensional changes due to them can be relatively large. Unless these dimensional variations (however caused) changes are compensated for they can significantly affect the efficiency of edge-purging because of inaccurate centering of a wafer when placed on its respective platform. The present invention provides a simple and effective way of avoiding these difficulties.

SUMMARY OF THE INVENTION

In accordance with one aspect of the invention there is provided apparatus for processing of semiconductor wafers. The apparatus comprises a processing chamber; a first and a second wafer-holding platform; a plurality of wafer lifting pins associated with each platform, the pins being computer controlled to raise and lower them; a handling mechanism having a first and a second wafer-holding blade for inserting wafers into the chamber and for placing the wafers onto respective platforms, the handling mechanism being computer controlled to insert wafers into the chamber and to accurately place each wafer onto a respective platform; and a computer for controlling the wafer mechanism, the lift pins, and for determining when a wafer is accurately centered over a respective platform, the computer raising the lift pins of the first platform to raise a first wafer above its respective blade when the first wafer is accurately centered over the platform, then centering a second wafer over the second platform, raising the lift pins of the second platform to raise the second wafer above its respective blade, and thereafter withdrawing the blades from the chamber for subsequent processing of the wafers, such that each wafer is accurately centered on its respective platform in spite of thermal expansion and contraction of the chamber and changes in the exact positions of the platforms within the chamber.

In accordance with another aspect of the invention there is provided a method for accurately placing a first and a second semiconductor wafer onto respective platforms in a processing chamber which is subject to thermal expansion and contraction due to changes in temperature. The method comprises the steps of inserting the wafers into a processing chamber using a remotely controlled wafer-handling mechanism with a pair of wafer-supporting blades; centering the first wafer over its respective platform; lifting the first wafer off of the blade supporting it; centering the second wafer over its respective platform; lifting the second wafer off of the blade supporting it; withdrawing the blades from the chamber; and lowering the wafers onto their respective platforms.

A better understanding of the invention together with a fuller appreciation of its many advantages will best be gained from a study of the following description given in conjunction with the accompanying drawings and claims.

The drawings are not necessarily to scale.

Detailed Description

Figure 1:
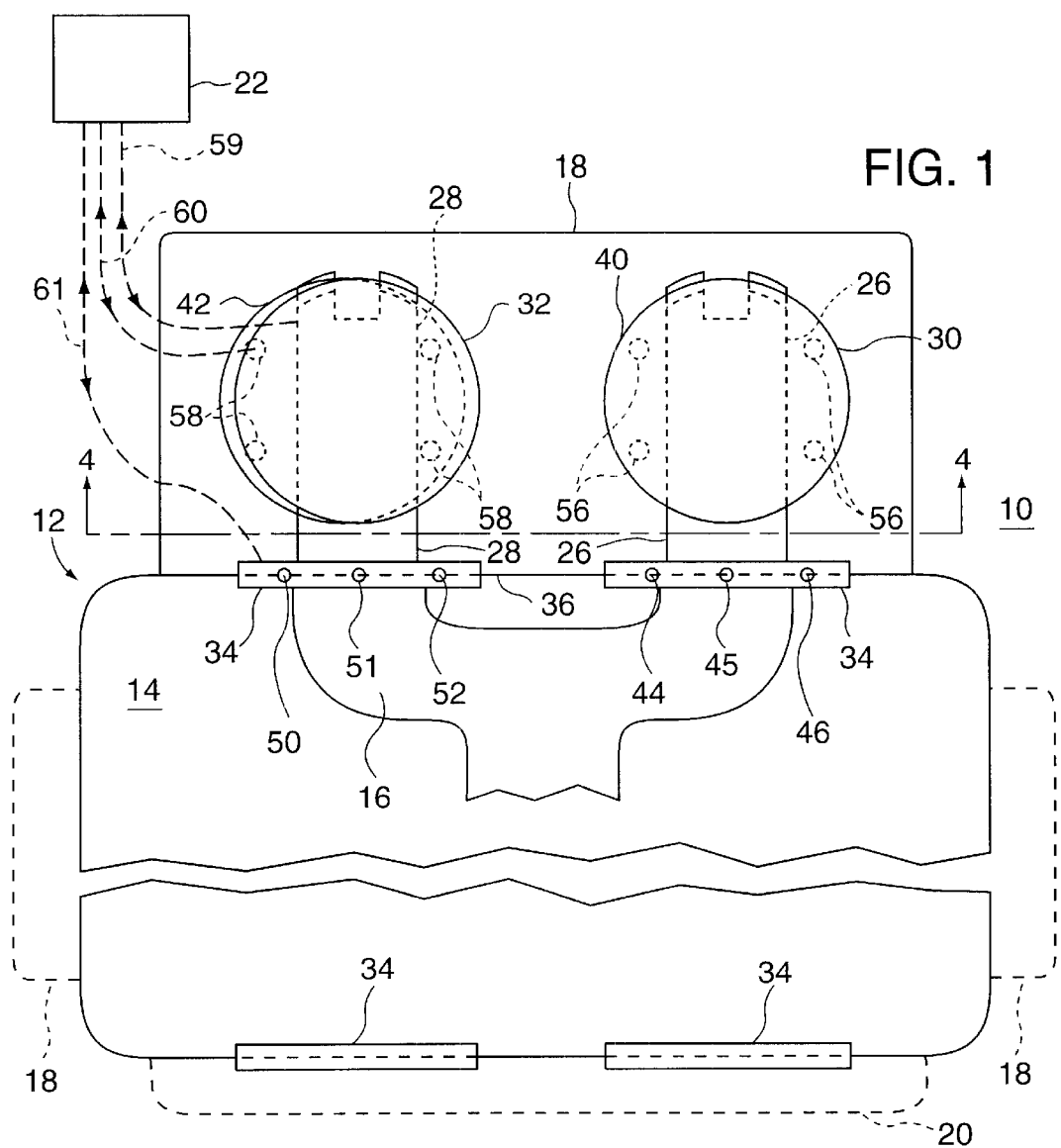
FIG. 1 is a schematic plan view, partially broken away, of apparatus for processing semiconductor wafers and embodying features of the invention.

Referring now to FIG. 1, there is shown schematically, in plan view, an apparatus 10 for processing semiconductor wafers and embodying features of the invention. The apparatus 10 comprises a housing 12, a transfer chamber 14 (partially broken away), a wafer-handling mechanism 16 (only part of which is shown), a plurality of processing chambers 18 (two of which are shown in dashed outline) located around the transfer chamber 14, and a loadlock chamber 20 (shown in dashed outline). These and other parts of the apparatus 10 which are not shown may be similar to parts known in the art such as are shown in U.S. No. Pat. 5,855,681, which is incorporated herein by reference. A computer 22, associated with the apparatus 10, controls and coordinates the operation of a number of elements of the apparatus 10 in accordance with the invention, as will be described shortly.

The wafer-handling mechanism 16 has a first wafer-supporting blade 26 and a second such blade 28. Shown held aligned on the first blade 26 is a first semiconductor wafer 30, and aligned on the second blade 28 is a second semiconductor wafer 32. The blades 26 and 28 are shown with their respective wafers 30 and 32 already inserted by the mechanism 16 into the processing chamber 18. The mechanism 16 moves the wafers from the transfer chamber 14 through respective slit valves 34 in a wall 36 which separates the transfer chamber 14 from the processing chamber 18. When the wafer-holding mechanism 16 and its blades 26 and 28 are withdrawn from the processing chamber 18, the respective slit valves 34 are closed to hermetically seal the processing chamber 18. After processing in the chamber 18, the slit valves 34 are re-opened and the wafers 30 and 32 are picked up and withdrawn from the chamber 18 by the wafer-handling mechanism 16. The processed wafers may then be returned to the loadlock chamber 22 and another pair of wafers ready for processing inserted into the chamber 18, and so on.

Beneath the wafer 30 in the chamber 18 is a first platform (or susceptor) 40, and beneath the wafer 32 is a second platform (or susceptor) 42. With the wafers 30 and 32 in the position shown in FIG. 1 the wafer 30 is centered above its respective platform 40, but the wafer 32 is off-center relative to the platform 42. This illustrates the effect of thermal expansion of the chamber 18, and corresponding change in the distance between the centers of the platforms 40 and 42 caused by change in temperature within the chamber 18. The distance between the centers of the wafers 30 and 32, however, is determined by the fixed separation between the respective blades 26 and 28 of the wafer-handling mechanism 16. Thus the centers between the wafers 30 and 32 will differ by an uncertain amount from the centers between the platforms 40 and 42 depending on variations in temperature within the processing chamber 18. The present invention provides a simple and effective system for accurately centering each wafer 30 and 32 upon its respective platform 40 and 42 regardless of temperature (and dimensional) variations.

Still referring to FIG. 1, the blade 26 with its wafer 30 has entered the chamber 18 through a respective slit valve 34 which has three precisely placed position sensors 44, 45 and 46 each of which generates a narrow, vertical light beam (not shown). Similarly, the blade 28 with its wafer 32 has entered the chamber 18 through a respective slit valve 34 which has three precisely placed position sensors 50, 51, 52 (identical to the sensors 44, 45, 46) and which generate vertical light beams (not shown).

The platform 40 has a set of four vertically movable lift pins 56 which on command are raised above the level of the platform 40 to lift the wafer 40 off of the blade 26. Similarly, the platform 42 has a set of three or more lift pins 58 (four being shown) which are raised and lowered on command independently of the lift pins 56. The lift pins 58 are raised only after the wafer 32 has been subsequently centered over the platform 42 by the wafer-handling mechanism 16, the wafer 30 having been already raised by the lift pins 56. This sequence will be further explained in connection with FIGS. 4 and 5.

The computer 22 controls the operation of the wafer-handling mechanism 16 and the sequential raising and lowering of the lift pins 56 and the lift pins 58. To this end, the computer 22 is coupled to the wafer-handling mechanism 16 by a data and control link schematically indicated by a dashed line at 59. The computer 22 is similarly coupled to drive means (not shown) for the respective sets of lift pins 56 and 58 by a data and control link schematically indicated at 60. To enhance the placement accuracy of the robot, a set of 3 or more optical sensors (44/45/46 & 50/51/52) can be used to identify the wafer positions with respect to the blades. Signals from the respective sets of position sensors 44, 45, 46 and 50, 51, 52 are coupled to the computer 22 by a data link schematically indicated at 61.

Before the wafer-handling mechanism 16 first begins to insert the wafers 30 and 32 into the processing chamber 18, none of the light beams provided by the respective sets of position sensors 44, 45, 46 and 50, 51, 52 is yet broken or obstructed. As the wafers 30 and 32 are inserted into the chamber 18, they pass through the light beams from the respective sets of position sensors 44, 45, 46 and 50, 51, 52, and corresponding signals are sent via the data link 61 to the computer 22. As will be explained shortly, signals from the position sensors 44, 45, 46 and 50, 51, 52 enable the computer 22 to accurately center in turn the wafers 30 and 32 over their respective platforms 40 and 42. The computer 22 then commands the wafer-handling mechanism 16 to move the wafer 30 as required until the wafer 30 is exactly centered over the platform 40. The computer 22 next commands the drive mechanism (not shown) controlling the set of lift pins 56 of the platform 40 to raise the wafer 30 above and out of contact with its respective blade 26. The wafer 30 remains for the time being in this raised position, with its center accurately aligned over the center of the platform 40. Next, the wafer-handling mechanism 16 is commanded by the computer 22 to move the wafer 32 into alignment with the center of its platform 42, and the lift pins 58 commanded to raise the wafer 32 above the platform 42 following a similar sequence of sensor signals and computer commands described above in connection with the wafer 30. After both wafers 30 and 32 have been lifted off of the blades 26 and 28 of the wafer-handling mechanism 16, it is withdrawn on command by the computer 22 from the chamber 18, the wafers 30 and 32 lowered onto their respective platforms 40 and 42, the respective slit valves 34 closed, and processing of the wafers begun. Alternately, the wafer handling mechanism may be retracted fully to the start position facing the chamber opening after the unloading of the first wafer. The second wafer will pass through the sensor gates one more time and the correct position calculated on the fly for the second wafer before the robot has come to a complete stop. This method will provide improved motion control with a slight trade off in wafer handling time.

Figure 2:
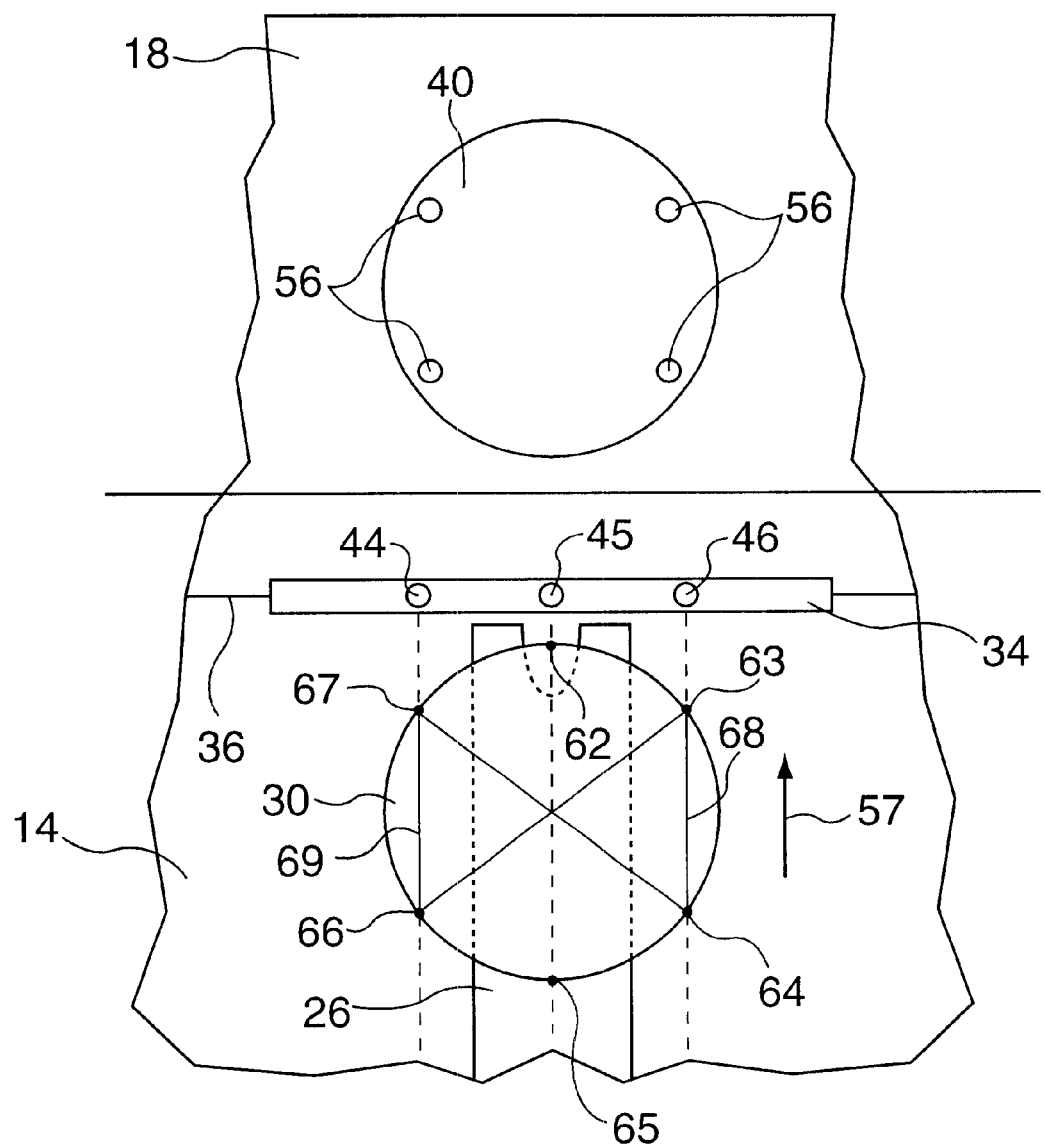
FIG. 2 is a schematic plan view, partially broken away, of a portion of the apparatus of FIG. 1.

Referring now to FIG. 2, there is shown a portion of the apparatus 10 schematically illustrating the position of the wafer 30 and its blade 26 as they are about to enter the chamber 18 (the wafer 32 and the blade 28 not being shown here). For the sake of illustration the wafer 30 is shown centered with respect to the position sensors 44, 45, 46 in the respective slit valve 34, which sensors are precisely positioned in fixed relation with respect to the platform 40.

The wafer 30 is moved by the blade 26 on command of the computer 22 from the position shown in FIG. 2 into the chamber 18 at a velocity and direction indicated by an arrow 57. The drive mechanism (not shown) of the robot 16 and the blade 26 sends to and receives signals from the computer 22 via the link 59 (see FIG. 1) and so the velocity (indicated by the arrow 57) of the wafer 30 and hence its position calculated from a starting point (not shown) are known to the computer 22 at any given instant. As the wafer 30 passes through the slit valve 34, the rim of the wafer disturbs or interferes with the respective light beams (not shown) of the position sensors 44, 45, 46 at a series of reference or marker points here indicated at 62, 63, 64, 65, 66 and 67 around the edge of the wafer 30. By noting the times of occurrence of the respective points 62, 63, 64, 65, 66 and 67 in accordance with signals from the sensors 44, 45, 46 the computer 22 calculates the lengths of a chord 68 between the points 63 and 64 and the length of a chord 69 between the points 67 and 66. From these values the computer 22 calculates the amount by which (if any) the center of the wafer 30 may be out of alignment with the center of the platform 40 as the wafer 30 is moved by the robot 16 over the platform 40. The computer 22 accordingly corrects for any such misalignment so that on being fully inserted into the chamber 18, the wafer 30 is precisely centered over the platform 40 (see FIG. 1). In similar fashion the computer 22 calculates from signals sent by the position sensors 50, 51, 52 the amount the wafer 32 subsequently needs to be moved laterally and extended to center it precisely over the platform 42. A fuller description of the position sensors 44, 45, 46 and 50, 51, 52 is given in a patent application entitled "Sensors In Slit/Gate Valve", Provisional Application Serial No. 60/216,981, filed Jul. 7, 2000, and having a common assignee with the present application. This provisional application is incorporated herein by reference.

Figure 3:
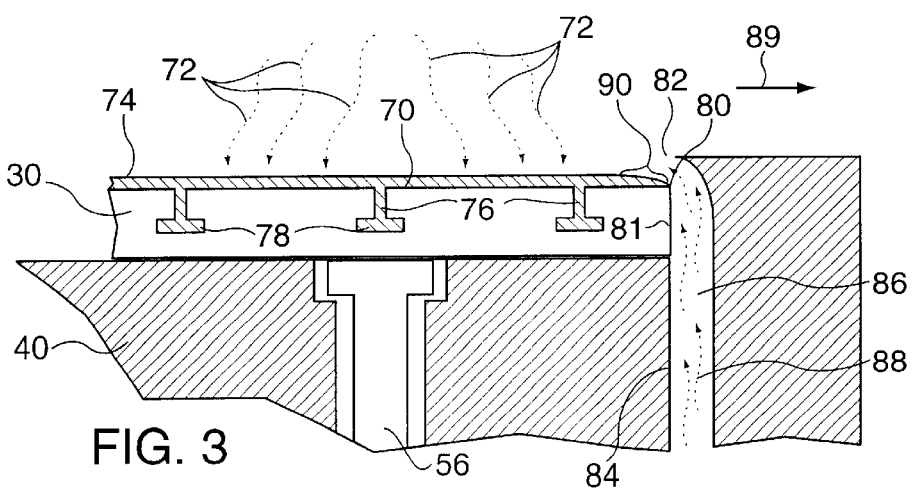
FIG. 3 is a schematic side section view partially broken away of a semiconductor wafer illustrating metal deposition and edge-purging during chemical vapor deposition in the apparatus of FIG. 1.

Referring now to FIG. 3, there is shown a side view with certain dimensions exaggerated for the sake of illustration, schematically showing the wafer 30 resting on the platform 40 and undergoing chemical vapor deposition of metal (e.g., tungsten) on an exposed surface 70 of the wafer. Downward pointing arrows 72 indicate a flow of precursor vapor (e.g., $WF_6$) toward and upon the wafer 30. The vapor on contacting the surface 70, deposits a metal layer 74, the wafer 30 being heated to a suitable temperature (e.g., several hundred degrees Centigrade) by the platform 40. The wafer 30 contains vertical vias 76 extending from the surface 70 some distance down to exposed portions 78 of electrical connections (not otherwise shown) within the wafer 30. The vias 76 prior to metalization have narrow diameters (e.g., 0.13 micron) and depths of 4 to 5 times this amount. As metal is deposited on the surface 70 of the wafer 30, the vias 76 are metalized all the way down to the exposed portions 78 of the electrical connections. After the vias 76 are fully metalized, the metal layer 74 is then polished away to leave exposed upper conductive ends of the vias 76 at the surface 70. This is not shown in FIG. 3.

It is desirable when polishing away the metal layer 74 in order to expose the vias 76, that the layer 74 be entirely removed with no traces of it remaining near an outer edge 80 or a vertical surface 81 of the rim of the wafer 30. To achieve this, the platform 40 incorporates an "edge-purging" arrangement comprising an annular orifice 82 around an outer edge 84 of the platform 40, and a narrow vertical passage 86 through which flows a stream of inert gas (e.g., argon or argon-helium) indicated by short arrows 88. The upward flow of the inert gas stream 88 inhibits the precursor vapor 72 from flowing onto the wafer 30 at its edge 80 or flowing down over a vertical surface 81 thereof. The precursor vapor 72 and the inert gas stream 88 are exhausted from the chamber 18 as indicated by an arrow 89 through an exhaust port (not shown). Thus, unwanted depositing of metal at the edge 80 and surface 81 of the wafer 30 during chemical vapor deposition is prevented. Because of the inert gas stream 88, the metal layer 74 tapers to zero thickness before reaching the wafer edge 80 in an annular zone indicated by a bracket 90. As a result the subsequent polishing away and complete removal of the metal layer 74 is facilitated. In order for the tapered zone 90 of the metal layer 74 to taper to zero thickness uniformly before reaching the edge 80 of the wafer 30, the wafer 30 must be accurately centered on the platform 40. The present invention provides for centering each wafer 30 and 32 on its respective platform 40 and 42 with the accuracy needed to obtain controlled metalization such as illustrated in FIG. 3.

Figure 4:
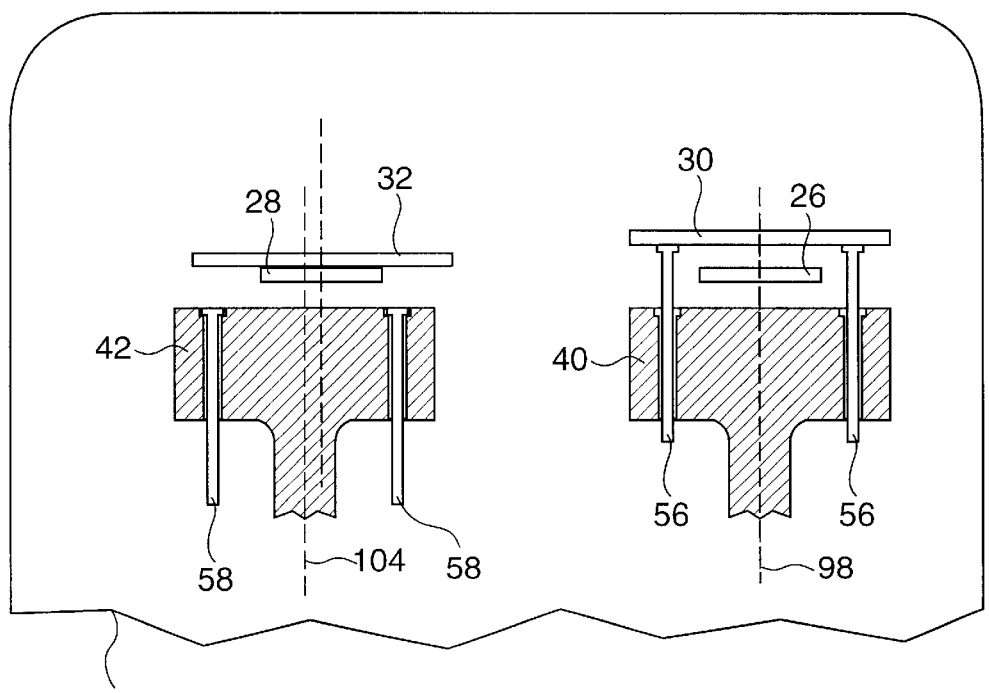
FIG. 4 is a section view taken as illustrated by a dashed line 4—4 in FIG. 1 and showing schematically initial steps in accordance with the invention in accurately placing first and second wafers onto respective platforms within a single processing chamber of the apparatus of FIG. 1.

Referring now to FIG. 4, there is shown a cross-section, taken as indicated by a dashed line 4—4 in FIG. 1, schematically showing, at one moment in time, the relative positions of the wafers 30 and 32, the platforms 40 and 42, the blades 26 and 28, the sets of position sensors 44, 45, 46 and 50, 51, 52, and the sets of lift pins 56 and 58. The wafer 30 has been lifted off of its blade 26 by the lift pins 56. The computer 22 has determined from signals from the sensors 44, 45, 46 that the wafer 30 now has its center aligned with a center line 98 of the platform 40, and accordingly raises the lift pins 56 and wafer 30 up off the blade 26 to the position shown here. This frees the wafer-handling mechanism 16 to then move the wafer 32, still held on its blade 28, into center alignment with the platform 42. The computer 22 in accordance with signals previously received from the sensors 50, 51, 52 commands the mechanism 16 to move the wafer 32 into aligned position. The wafer 32 is shown out of position with respect to the platform 42 as viewed in FIG. 4. The wafer 30 remains for a short time resting on the pins 56 and properly centered over the platform 40 while the wafer 32 is being centered.

Figure 5:
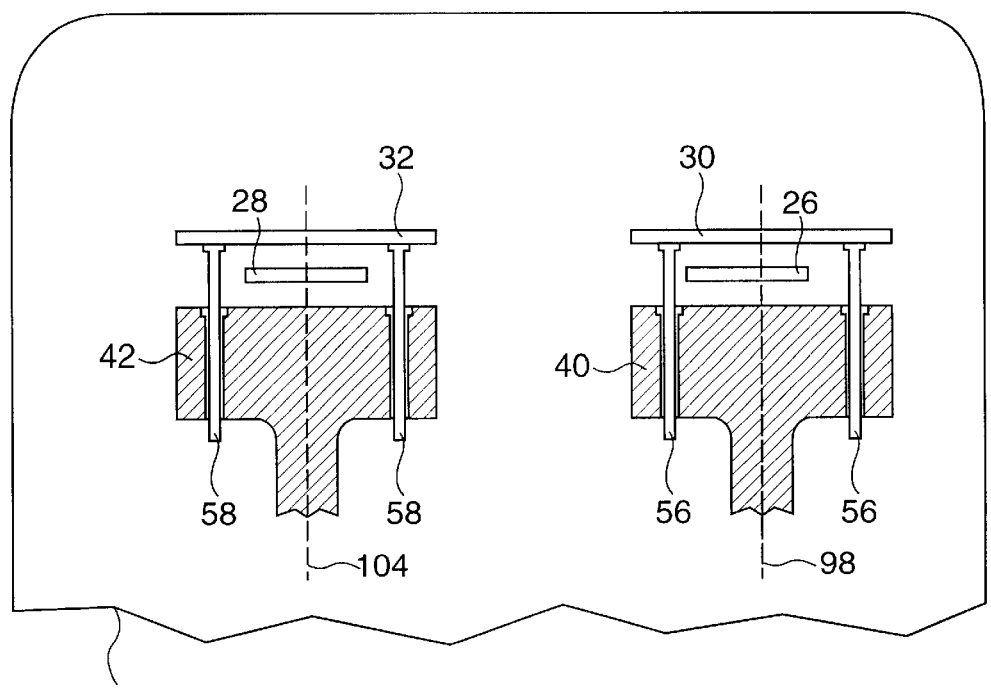
FIG. 5 is a section view similar to FIG. 4 showing schematically further steps in accordance with the invention in accurately placing the wafers onto their respective platforms.

Referring now to FIG. 5, which is similar to FIG. 4, there is shown the relative positions of the wafers 30, 32 and the platforms 40, 42, as well as other elements shown in FIG. 4, after the wafer 32 has been centered over the platform 42. The computer 22 upon determining that the wafer 32 has been centered over the platform 42, which has a centerline 104, raises the lift pins 58 to lift the wafer 32 up off of the blade 28. The computer 22 then withdraws the wafer-handling mechanism 16 and its blades 26, 28 from the chamber 18, lowers the lift pins 56 and 58 so that the wafers properly rest on their respective platforms, and closes the slit valves 34 (not shown here) so that processing of the wafers can begin.

The above description is intended in illustration and not in limitation of the invention. Various changes in the apparatus and method described may occur to those skilled in the art and can be made without departing from the spirit or scope of the invention as set forth and as defined by the accompanying claims. The invention is not restricted to any particular size of wafer, or to a particular precursor compound or to a particular edge-purging structure, or to a particular number of lift pins. Moreover, position sensors other than those illustrated may be used.

What is claimed is:

1. Apparatus for processing of semiconductor wafers, the apparatus comprising;

a processing chamber;

a first and a second wafer-holding platform;

a set of wafer lifting pins associated with each platform, the pins being computer controlled to raise and lower them;

a handling mechanism having a first and a second wafer-holding blade for inserting wafers into the chamber and for holding the wafers over respective platforms, the handling mechanism being computer controlled to insert wafers into the chamber and to accurately place each wafer over a respective platform; and a computer for controlling the wafer mechanism and the lift pins, and for determining when a wafer is accurately centered over a respective platform, the computer raising the lift pins of the first platform to raise a first wafer above its respective blade when the first wafer is accurately centered over the platform, then centering a second wafer over the second platform, raising the lift pins of the second platform to raise the second wafer above its respective blade, and thereafter withdrawing the blades from the chamber for subsequent processing of the wafers whereby each wafer is accurately centered on its respective platform in spite of thermal expansion and contraction of the chamber and changes in the exact positions of the platforms within the chamber.

2. The apparatus of claim 1 wherein the computer determines whether a wafer is centered over its respective platform by means of signals from position sensors.

3. The apparatus of claim 1 further comprising:
a first set of position sensors associated with the first platform;
a second set of position sensors associated with the second platform; and
a data link coupling the computer to the position sensors.

4. Apparatus for processing semiconductor wafers comprising:
a transfer chamber;
a load-lock chamber adjacent the transfer chamber;
at least one processing chamber adjacent the transfer chamber;
a first and a second platform in the processing chamber for holding wafers during processing thereof;
a wafer-handling mechanism in the transfer chamber for transferring wafers out of the load-lock chamber and into the processing chamber and vice versa, the mechanism having first and second wafer-supporting blades;
a plurality of slit valves for hermetically sealing and unsealing the transfer chamber from the load-lock chamber and from the processing chamber during transfer of wafers from one chamber to another;
a first and a second set of lift pins associated with the first and second platforms, respectively, the lift pins being selectively controllable to lift wafers off of the blades and then onto the respective platforms;
first and second position sensors associated with the first and second platforms, respectively, to signal when a wafer is centered above its respective platform by the wafer-handling mechanism; and
a computer for controlling the wafer-handling mechanism to center the first wafer over its respective platform, for actuating the first set of lift pins to lift the wafer off of the first blade when signals from the first position sensor indicate that the center of the wafer is aligned with the center of the platform, and then similarly centering the second wafer over the second platform, actuating the second set of lift pins, removing the blades from the processing chamber, and lowering the wafers onto their respective platforms whereby each wafer is accurately positioned on its platform in spite of thermal expansion and contraction of the processing chamber due to variations in temperature.

5. A method for accurately placing a first and a second semiconductor wafer onto respective platforms in a processing chamber which is subject to thermal expansion and contraction due to changes in temperature, the method comprising the steps of:
inserting the wafers into a processing chamber using a remotely controlled wafer-handling mechanism with a pair of wafer-supporting blades;
centering the first wafer over its respective platform;
lifting the first wafer off of the blade supporting it;
centering the second wafer over its respective platform;
lifting the second wafer off of the blade supporting it;
withdrawing the blades from the chamber; and
lowering the wafers onto their respective platforms.

6. A method for processing of semiconductor wafers comprising the steps of:
placing in proper alignment a first and a second wafer onto a pair of blades carried by a remotely controlled wafer-handling mechanism;
controlling the mechanism to insert the wafers into a processing chamber having a first and a second platform;
determining from position sensor signals whether the first wafer is centered over the first platform and then controlling the wafer-handling mechanism in response to the sensor signals to accurately position the first wafer in alignment over a center line of the first platform;
raising by remotely controlled lift pins the first wafer off of the respective blade supporting it when the wafer has been centered over its respective platform;
then controlling the wafer-handling mechanism in accordance with position sensor signals to move the second wafer into alignment with a center line of the second platform;
raising by remotely controlled lift pins the second wafer off of the respective blade supporting it when the wafer has been centered over its respective platform;
removing the blades from the chamber; and
lowering the respective lift pins to place the first and second wafers accurately centered upon the first and second platforms, such that each wafer is properly placed onto its respective platform in spite of thermal expansion and contraction within the chamber caused by variations in temperature and in turn causing changes in the exact positions of the platforms.

7. A method for accurately placing a first and a second semiconductor wafer onto respective platforms in a processing chamber which is subject to thermal expansion and contraction due to changes in temperature, the method comprising the steps of:
inserting the wafers into a processing chamber using a remotely controlled wafer-handling mechanism with a pair of wafer-supporting blades;
centering the first wafer over its respective platform;
lifting the first wafer off of the blade supporting it;
centering the second wafer over its respective platform;
lifting the second wafer off of the blade supporting it;
withdrawing the blades from the chamber;
lowering the wafers onto their respective platforms;
hermetically sealing the chamber;
depositing by chemical vapor deposition using a suitable precursor compound respective metal layers onto exposed surfaces of the wafers; and
edge-purging by inert gas to prevent the precursor compound from depositing metal over the outer edge and down the rim of each wafer, the wafers being centered on their respective platforms with sufficient accuracy for the edge-purging to act uniformly around the circumference of each wafer.

8. A method for processing of semiconductor wafers comprising the steps of:

placing in proper alignment a first and a second wafer onto a pair of blades carried by a remotely controlled wafer-handling mechanism;

controlling the mechanism to insert the wafers into a processing chamber having a first and a second platform;

determining from position sensor signals whether the first wafer is centered over the first platform and then controlling the wafer-handling mechanism in response to the sensor signals to accurately position the first wafer in alignment over a centerline of the first platform;

raising by remotely controlled lift pins the first wafer off of the respective blade supporting it when the wafer has been centered over its respective platform;

then controlling the wafer-handling mechanism in accordance with position sensor signals to move the second wafer into alignment with a centerline of the second platform;

raising by remotely controlled lift pins the second wafer off of the respective blade supporting it when the wafer has been centered over its respective platform;

removing the blades from the chamber; and lowering the respective lift pins to place the first and second wafers upon the first and second platforms;

hermetically sealing the chamber;

depositing by chemical vapor deposition using a precursor compound respective metal layers onto exposed surfaces of the wafers having narrow and deep vias to metalize the vias; and edge-purging by inert gas to prevent the metal being deposited from reaching an outer edge and vertical surface of the rim of each wafer, the wafers being centered on their respective platforms with an accuracy needed for uniform edge-purging.

9. The method of claim 8 wherein the precursor compound is $WF_6$.

10. Apparatus for accurately placing a first and a second semiconductor wafer onto respective platforms in a processing chamber which is subject to thermal expansion and contraction due to changes in temperature, the apparatus comprising:

a wafer-handling mechanism comprising a pair of wafer-supporting blades and being capable of inserting the wafers into a processing chamber;

means for centering the first wafer over its respective platform;

means for lifting the first wafer off of the blade supporting it;

means for centering the second wafer over its respective platform;

means for lifting the second wafer off of the blade supporting it;

means for withdrawing the blades from the chamber; and means for lowering the wafers onto their respective platforms.

* * * * *